(12) United States Patent
Pankratz

(10) Patent No.: US 7,514,935 B2
(45) Date of Patent: Apr. 7, 2009

(54) SYSTEM AND METHOD FOR MANAGING POWER SUPPLIED TO A PLASMA CHAMBER

(75) Inventor: Joshua Brian Pankratz, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 146 days.

(21) Appl. No.: 11/531,599

(22) Filed: Sep. 13, 2006

(65) Prior Publication Data

US 2008/0061794 A1    Mar. 13, 2008

(51) Int. Cl.
*G01R 31/08* (2006.01)
*H01H 9/50* (2006.01)

(52) U.S. Cl. ........................................ 324/536
(58) Field of Classification Search ............... 324/536
See application file for complete search history.

(56) References Cited

U.S. PATENT DOCUMENTS

| | | | |
|---|---|---|---|
| 3,867,669 A | 2/1975 | Krasik | |
| 4,428,023 A | 1/1984 | Maier | |
| 4,459,629 A | 7/1984 | Titus | |
| 5,192,894 A | 3/1993 | Teschner | |
| 5,241,152 A | 8/1993 | Anderson | |
| 5,427,669 A | 6/1995 | Drummond | |
| 5,535,906 A | 7/1996 | Drummond | |
| 5,584,974 A | 12/1996 | Sellers | |
| 5,645,698 A | 7/1997 | Okano | |
| 5,651,865 A | 7/1997 | Sellers | |
| 5,682,067 A | 10/1997 | Manley | |
| 5,718,813 A | 2/1998 | Drummond | |
| 6,001,224 A | 12/1999 | Drummond | |
| 6,024,844 A | 2/2000 | Drummond | |
| 6,522,076 B2 | 2/2003 | Goedicke | |
| 6,621,674 B1 | 9/2003 | Zahringer | |
| 6,876,205 B2 * | 4/2005 | Walde et al. | ............... 324/536 |
| 6,943,317 B1 | 9/2005 | Ilic | |

FOREIGN PATENT DOCUMENTS

| | | |
|---|---|---|
| EP | 0564789 B1 | 11/1997 |
| EP | 0564789 A1 | 10/1998 |

OTHER PUBLICATIONS

ISA/US, International Search Report and Written Opinion of the International Searching Authority, Aug. 29, 2008, USA.

* cited by examiner

*Primary Examiner*—Diego Gutierrez
*Assistant Examiner*—Amy He

(57) ABSTRACT

A system and method for managing power delivered to a processing chamber is described. In one embodiment power is delivered to the processing chamber with a power cable, the power cable storing energy and including a first and second conductors, the first conductor having a first voltage polarity relative to the second conductor. The voltage polarity of the first conductor is reversed relative to the second conductor and at least a portion of the stored energy in the power cable is provided to the plasma chamber while the polarity of the first power cable is reversed.

10 Claims, 7 Drawing Sheets

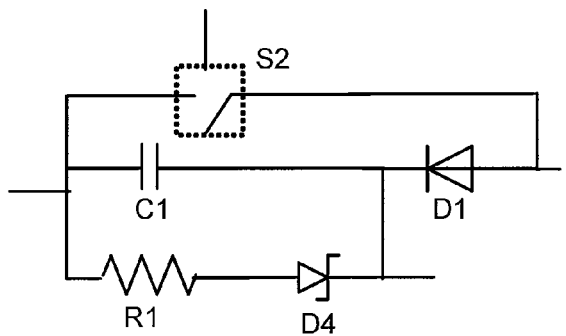
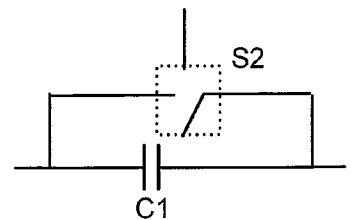
FIG. 5E  FIG. 5F
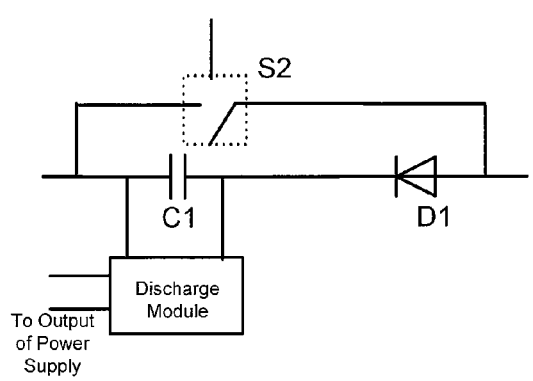
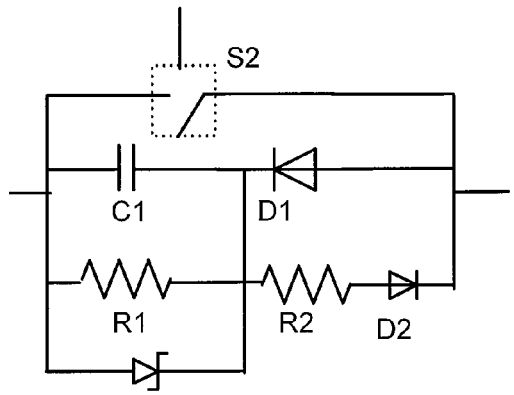
FIG. 5G  FIG. 5H

SYSTEM AND METHOD FOR MANAGING POWER SUPPLIED TO A PLASMA CHAMBER

FIELD OF THE INVENTION

This invention relates generally to power supplies for plasma processing applications, and more particularly to systems and methods to limit arcing thereon.

BACKGROUND OF THE INVENTION

In plasma processing applications arcs are known to develop when a discharge occurs between a point on a cathode where charge has accumulated and a point on the anode. If not extinguished quickly, arcs can be very detrimental to the process and the quality of the processed film.

Past approaches to arc control in plasma processes have focused upon the reduction of energy supplied by a power supply into an arc. In some power supplies, arcs are extinguished by turning off after the arc is detected. In variations of these past approaches, a shunt switch is placed across the power supply and is used to circulate inductor current inside of the power supply, and when the arc is extinguished, the shunt switch opens. These types of systems are effective to some extent, but are unable to provide the expedient arc mitigation often necessary in present processing environments.

In some systems, a second-power supply is employed, so that during an arc event, power from the first-power supply is removed from the plasma chamber and power from the second-power supply is provided to the plasma chamber with a reverse polarity of the first-power supply. Although, these systems enable arcs to be extinguished relatively quickly, the second-power supply adds substantial cost to the system in substantially increases a risk of failure.

Another approach that has proven to be effective in plasma processing applications (e.g., where relatively low power and low current is utilized) includes employing a tapped inductor in series with an output of a power supply and a shunt switch. The tapped inductor acts as an autotransformer and provides a reverse voltage that is a function of the turn ratio of the tapped inductor. Tapped inductors that can handle higher currents and provide the desired low-leakage inductance, however, are relatively expensive. And implementing cable with a sufficiently low inductance is also costly-especially at higher currents.

As process currents increase, one of the biggest problems in dealing with arc energy is the energy stored in the output cable, which is proportional to the square of the current carried by the cable. Problematically, this stored energy is not controllable by the power supply and the only path available to current generated from the stored energy is into the arc. As a consequence, the current from the stored energy may actually extend the life of the arc and add to the damage (e.g., to the work piece and/or chamber) caused by the arc. And cable designs that minimize stored energy (e.g., by minimizing an inductance of the cable), can quickly become costly and impractical to build when balancing such constraints as length, insulation, wire size, and cost.

Although present devices are functional for many applications, they are not sufficient for many implementations or are otherwise satisfactory. Accordingly, a system and method are needed to address the shortfalls of present technology and to provide other new and innovative features.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

The present invention can provide a system and method for managing power delivered to a processing chamber. In one exemplary embodiment, power is delivered to the processing chamber with a power cable that stores energy and includes first and second conductors, the first conductor having a first voltage polarity relative to the second conductor. In this embodiment, the voltage polarity of the first conductor relative to the second conductor is reversed and at least a portion of the stored energy in the power cable is provided to the plasma chamber while the polarity of the first power cable is reversed.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

FIGS. 5A-5H are schematic diagrams depicting exemplary embodiments of the voltage reversing module of FIGS. 3 and 4.

DETAILED DESCRIPTION

Figure 1:
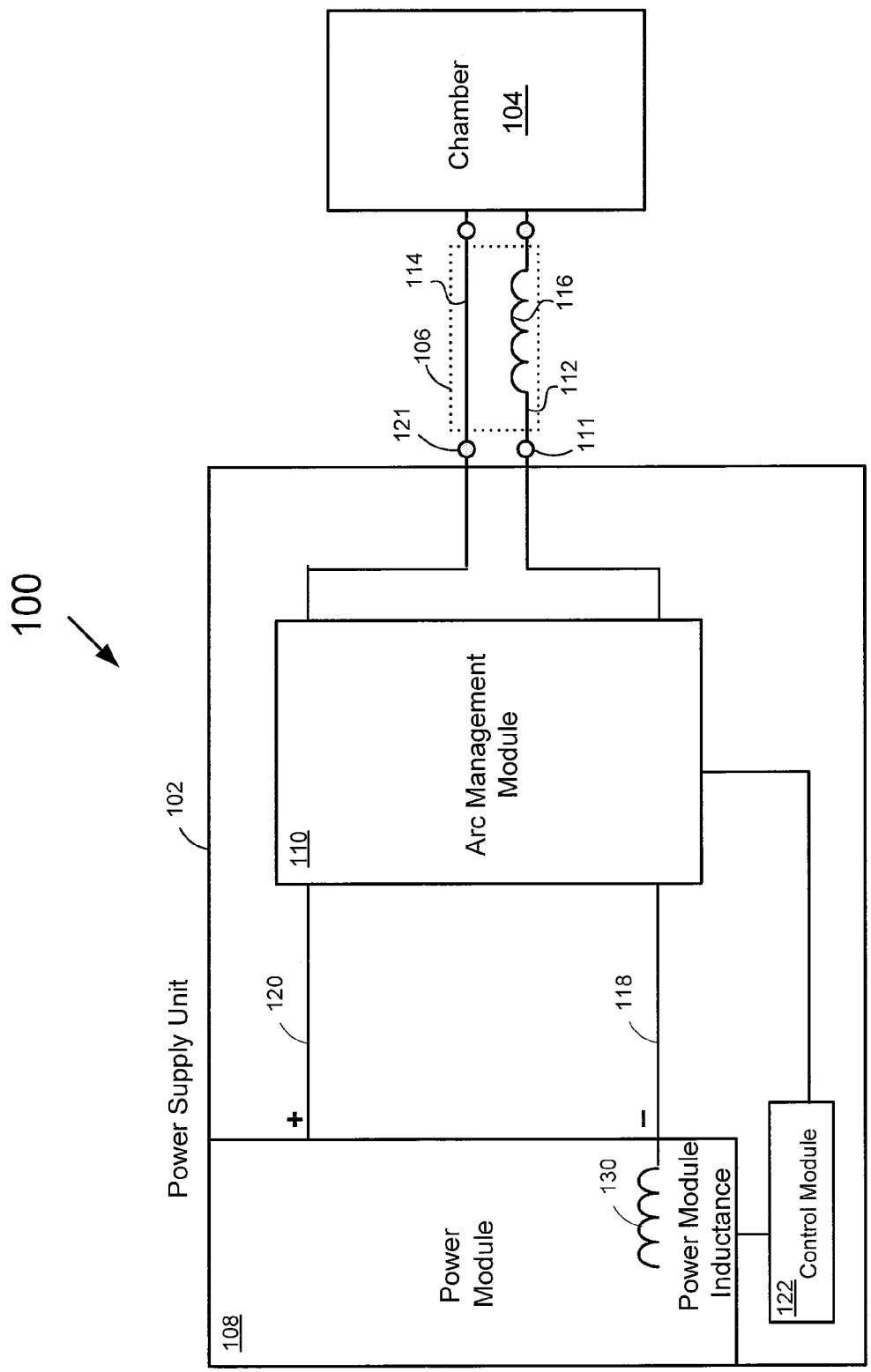
FIG. 1 is a block diagram depicting an exemplary embodiment of the invention.

Referring now to the drawings, where like or similar elements are designated with identical reference numerals throughout the several views, and referring in particular to FIG. 1, it illustrates is a block diagram 100 depicting an exemplary embodiment of the invention. Shown is a power supply unit 102 that is connected to a plasma chamber 104 with a supply cable 106. As depicted, the power supply unit 102 includes a power module 108 that is connected to an arc management module 110, and the arc management module 110 is connected to a first conductor 112 and a second conductor 114 of the supply cable 106. Also depicted is a control module 122 that is connected to both the power module 108 and the arc management module 110.

In many embodiments, the power module 108 is a switching power supply that is configured to provide a D.C. voltage at a sufficient level to ignite and sustain a plasma that is contained in the plasma chamber 104. The plasma is generally used to process a work piece that is not shown but is well known to those skilled in the art. In one embodiment the power module 108 is configured in accordance with a buck topology, but this is certainly not required and in other embodiments the power module 108 may include any other viable power supply topology. As shown, the power module 108 provides a negative voltage to the arc management module 110 via a first line 118 and a positive voltage to the arc management module 110 via a second line 120. And during a first mode of operation, the arc management module 110 provides the negative voltage to a first output terminal 111 and the positive voltage to a second terminal 121 the of the power supply 102.

The cable 106 is depicted as a single pair of conductors 112, 114 for simplicity, but in many embodiments the cable 106 is realized by a collection of two-conductor coaxial cables that connect the power supply unit 102 with the plasma chamber 104. And in other embodiments, the cable 106 is implemented with one or more twisted-pair cables. In yet other embodiments the cable 106 may be realized by any network of cable, including, but not certainly not limited to, a simple conductor hookup and quadrapole connections. As shown, the cable 106 includes an inductance, depicted for convenience as a single inductor 116, and as a consequence, the cable 106 is capable of storing energy in response to the conductors 112, 114 carrying current to the plasma.

In general, the arc management module 110 in the exemplary embodiment is configured to utilize the energy stored by the cable inductance 116 to reverse the voltage applied to the chamber 104, so that a positive voltage is applied to the first terminal 111 and a negative voltage is applied to the second terminal 121. In this way, the arc management module 110 prevents arcs from occurring in the first place and/or extinguishes arcs more quickly than systems that merely removing power from a plasma chamber.

In some embodiments for example, the arc management module 110 is configured to detect arcs in the chamber 104, and in response to a detected arc, receive energy from the cable 106, generate a reverse polarity, and provide the reverse polarity to the chamber 104 to extinguish the detected arc. In other embodiments, the arc management module 110 is adapted to periodically reverse the polarity that is provided at an output of the power supply 102 in order to help prevent arcs from occurring.

The control module 122 in this embodiment is configured to control one or more aspects of both the power module 108 and the arc management module 110. For example, during a first mode of operation, the control module 122 allows the power module 108 to deliver power with a first polarity (e.g., a negative voltage at the first output terminal 111 and a positive voltage at the second output terminal 121). When switching to a second mode of operation (e.g., in response to an arc being detected or a periodic clock signal), the control module 122 in this embodiment temporarily deactivates the power module 108 and prompts the arc management module 110 to both, receive energy from the cable 106 and/or other inductive elements in the current path from the chamber and use the energy to place a reverse polarity voltage (e.g., a positive voltage at the first output terminal 111 and a negative voltage at the second output terminal 121).

Beneficially, unlike prior techniques that implement a second power source to provide a reverse voltage to a plasma, the present embodiment utilizes existing energy from the supply cable 116 to generate a reverse voltage; thus reducing material costs while increasing reliability. Moreover, in some variations as described further herein, the arc management module 110 utilizes one or more protection components that are already available within a typical power supply, so implementing the arc management module 110 adds relatively little cost to existing power supply designs.

In addition, embodiments of the present invention actually utilize that which has been a significant problem in prior art solutions—the energy that is stored in the output cable and other inductive elements in the current path to/from the chamber. In some processing applications, the current provided to the chamber may approach, or even exceed, 1000 amps, and because the energy stored in the inductive elements is proportional to the square of the current, the stored energy in these high-current applications, if not properly handled, may cause damage to the work piece and/or chamber. Advantageously, many embodiments of the present invention actually utilize the stored energy to generate a reverse polarity voltage, which is applied to the chamber so as to substantially reduce the rate at which arcs may be extinguished. And because the energy stored in the output cable is no longer a detriment, the type of output cable that is used is much less of a concern. For example, as opposed to the tapped inductor approaches previously discussed, the inductance of the output cable need not be minimized; thus allowing more design choices, and hence, substantial cost savings relative to the tapped inductor approach.

Figure 2:
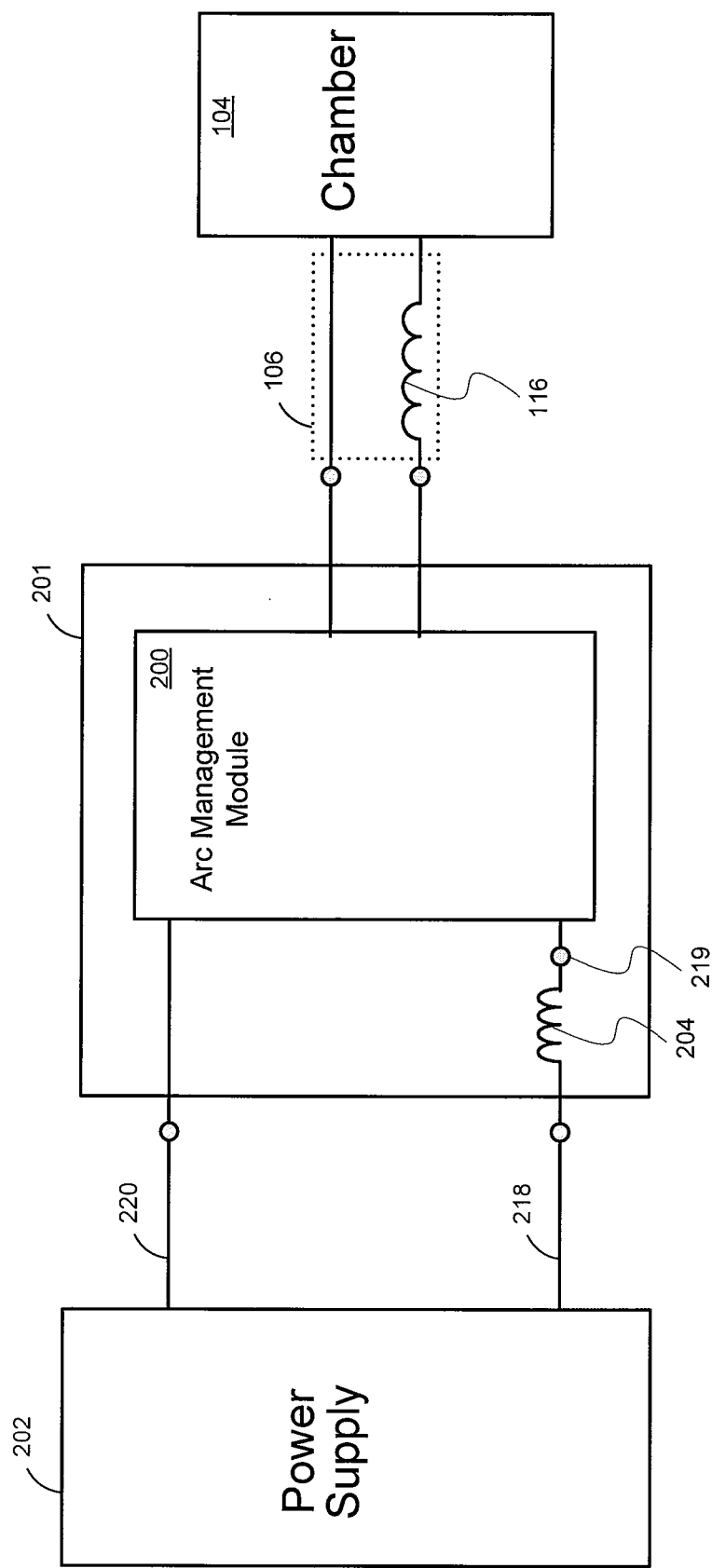
FIG. 2 is a block diagram depicting another exemplary embodiment of the invention.

As depicted in FIG. 1, the arc management module 110 in many embodiments is integrated as a component of the power supply 102, but this is certainly not required, and as shown in FIG. 2, an arc management module 200 in other embodiments may be added as part of an accessory 201 (e.g., as a retrofit) to an existing power supply 202. As depicted in FIG. 2, an inductor 204 in the accessory 201 is placed in series with a first output 218 of the power supply 202 in order to facilitate interoperability between the power supply 202 and the arc management module 200.

From the perspective of the power supply 202 for example, the inductor 204 helps to prevent the power supply 202 from "seeing" the operation of the arc-management module 200 as an arc, which could cause the power supply 202 to shutdown. As discussed further herein, for example, in several embodiments the arc management module 200 includes a shunt switch disposed between node 219 and a second output 220 of the power supply 202. In these embodiments, the inductor 204 helps to prevent the power supply 202 from short circuiting when the shunt switch is closed. And from the perspective of the arc-management module 200, the inductor 204 provides an impedance that helps to limit the amount of current the arc-management module 200 receives from the power supply 202 when the arc-management module 200 is providing a reverse-polarity voltage to the chamber 104. Moreover, the inductor 204 and the inductor 130 shown in FIG. 1, are part of respective inductive voltage dividers, which allow fast arc detection inside the arc management module 110, 200 by means of voltage detection.

Figure 3:
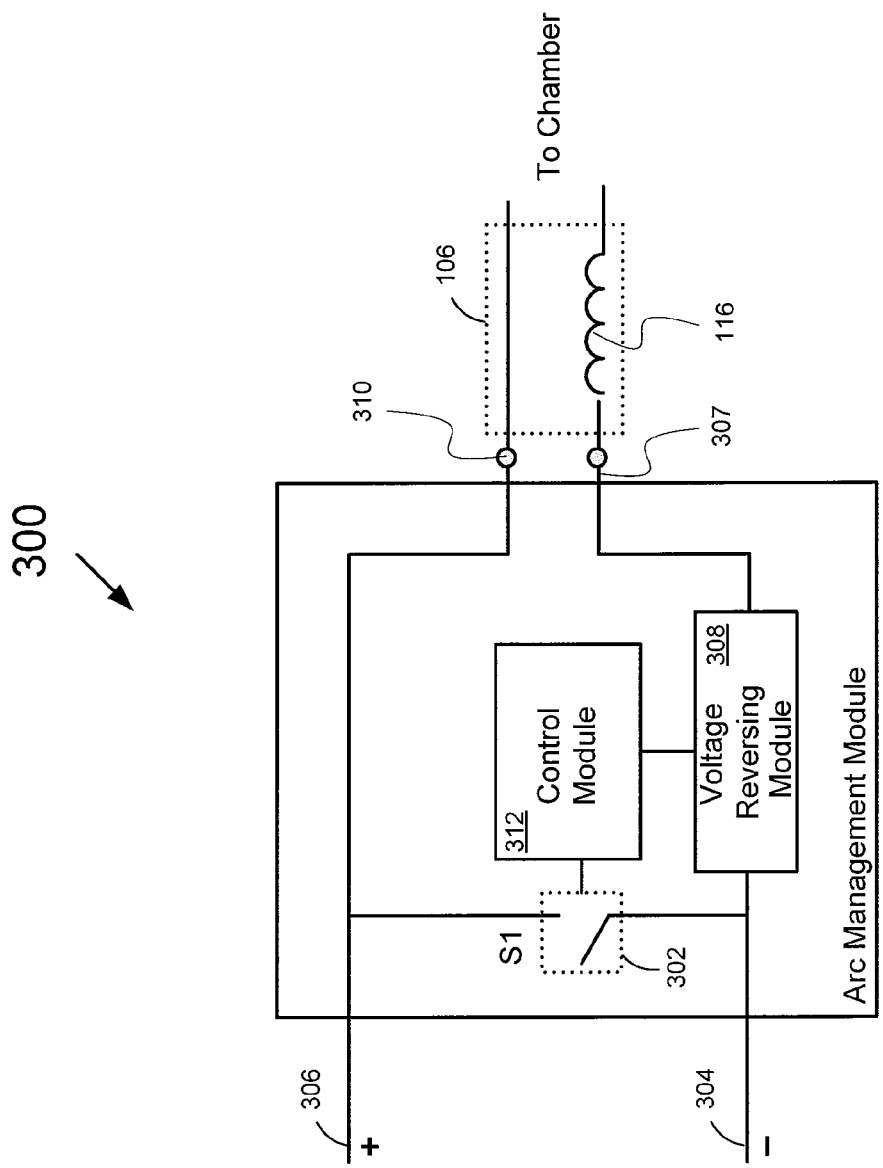
FIG. 3 is a block diagram depicting one embodiment of the arc-management modules of FIGS. 1 and 2.

Referring next to FIG. 3, shown is a block diagram 300 of one embodiment of the arc management modules 110, 210 depicted in FIGS. 1 and 2. As shown, the arc management module 300 in this embodiment includes a shunt switch 302 connected between a first input 304 and a second input 306, and a voltage-reversing module 308 connected in series between the first input terminal 304 and a first output terminal 307. And as shown, the first input 304 in this embodiment includes, for exemplary purposes, a negative voltage relative to a second input 306, and the second input 306 is also connected to a second output 310. Although the voltage reversing module 308 is depicted as being disposed along a negative leg of the arc management module 300 (e.g., along the path between the first input 304 and the first output 307), this is certainly not required, and in other embodiments the voltage reversing module 308 is configured to operate on the positive leg of the arc management module (e.g., along the path between second input 306 and second output 310).

Also depicted in FIG. 3 is a control module 312 that is in communication with both the shunt switch 302 and the voltage-reversing module 308. The illustrated arrangement of these components is logical and not meant to be an actual hardware diagram. Components of the control module 312 in some embodiments for example, are distributed, and in one variation, the control module 312 is realized, in part or in whole, by the control module 122 described with reference to FIG. 1.

The shunt switch 302 in this embodiment is arranged and configured, when closed, to short the first and second inputs 304, 306 in order to place the voltage-reversing module 308 across the output terminals 307, 310 and to limit or prevent additional current from the power module 108 or power supply 202 from flowing to the chamber 104. The shunt switch 302 in some embodiments is realized by an insulated gate bipolar transistor (IGBT), and in other embodiments is a field effect transistor (FET). In yet other embodiments the shunt switch 302 may be implemented by an Integrated Gate Commutated Thyristor (IGCT), a metal-oxide semiconductor-controlled thyristor (MCT), a bipolar switch, or silicon-controlled rectifier.

Although several embodiments described herein include a shunt switch to manage inductor current (e.g., from the inductance 130 of the power module 108), it is certainly contemplated that other devices may be implemented to mitigate the effects of inductor current and/or prevent inductor current from reaching the chamber altogether.

In general, the voltage reversing module 308 is configured to provide a voltage with a first polarity (e.g., a negative voltage on the first output terminal 307 relative to the second output terminal 310) during a first mode of operation, and provide a reverse voltage (e.g., a positive voltage on the first output terminal 307 relative to the second output terminal 310) during a second mode of operation. More specifically, in the first mode of operation, while a plasma-sustaining voltage with the first polarity is placed across the first and second output terminals 307, 310 the voltage reversing module 308 is configured to carry current on a return path from the chamber 104, through the first output terminal 307 to first input terminal 304. And during a second mode operation, the voltage reversing module 308 is configured to receive stored energy from the supply cable 106 and use the stored energy to generate the reverse voltage, which is applied across the output terminals 307, 310 to help prevent and/or help extinguish arcs within the chamber 104.

The control module 312 in this embodiment is generally configured to control the shunt switch 302 and the voltage-reversing module 308 so that the arc management module 300 provides the voltage with the first polarity to the supply cable 106 during the first mode of operation and provides the reverse voltage to the supply cable 106 during the second mode of operation. In the embodiment described with reference to FIG. 1, for example, during the first mode of operation, power from the power module 108 is provided with the first polarity to the chamber 104, and in the embodiment described with reference to FIG. 2, power from the power supply 202 is provided to the chamber 104 with the first polarity.

To initiate a second mode of operation (e.g., in response to a detected arc or in response to a clock signal), the control module 312 is configured to close the shunt switch 302. And simultaneously with, or subsequent to, the closing of the shunt switch 302, the control module 312 is configured to prompt the voltage-reversing module 308 to receive energy from the supply cable 106 and build a charge that is applied across the output terminals 307, 310 as a voltage with a polarity that is a reverse of the first polarity. In alternative embodiments, the voltage-reversing module 308 is configured to receive energy from the supply cable 106 in advance of the shunt switch opening.

The control module 312 in some embodiments is realized by processor-readable instructions stored in a memory in combination with a processor that is configured to execute the instructions, but this is certainly not required and in other embodiments the control module 312 is implemented in hardware. In variations, the control module 312 also includes arc-detection components (not shown), which may include a current transducer and/or a voltage transducer as well as associated control logic.

In other implementations, the control module 312 includes frequency-generation components to enable the control module 312 to send a periodic clock signal that is used to time the switching of the shunt switch 302 and voltage reversing module 308 between first and second modes of operation. In some embodiments for example, the control module 312 is configured to provide switching pulses to the shunt switch 302 and the voltage reversing module 308 at a rate between approximately 500 Hz and 500 kHz, depending upon, for example, the specific application.

In yet other embodiments the control module 312 is configured to both respond to detected arcs and to provide periodic switching pulses to the shunt switch 302 and the voltage reversing module 308. In these embodiments, the voltage reversing module 308 operates to both prevent arcs and to respond to arcs if they do occur.

Although the voltage reversing module 308 is generally described as using energy from the supply cable 106 to generate a reverse voltage, in some implementations (e.g., high-current implementations) a substantial amount of energy is also stored in the inductance of a loop formed between the positive and negative terminals of the shunt switch 302, which includes the supply cable 106, the plasma chamber 104, and the voltage reversing module 308. Moreover, it is contemplated that other implementations may be employed to utilize energy that is stored as a result of current flow to/from a plasma chamber.

Figure 4:
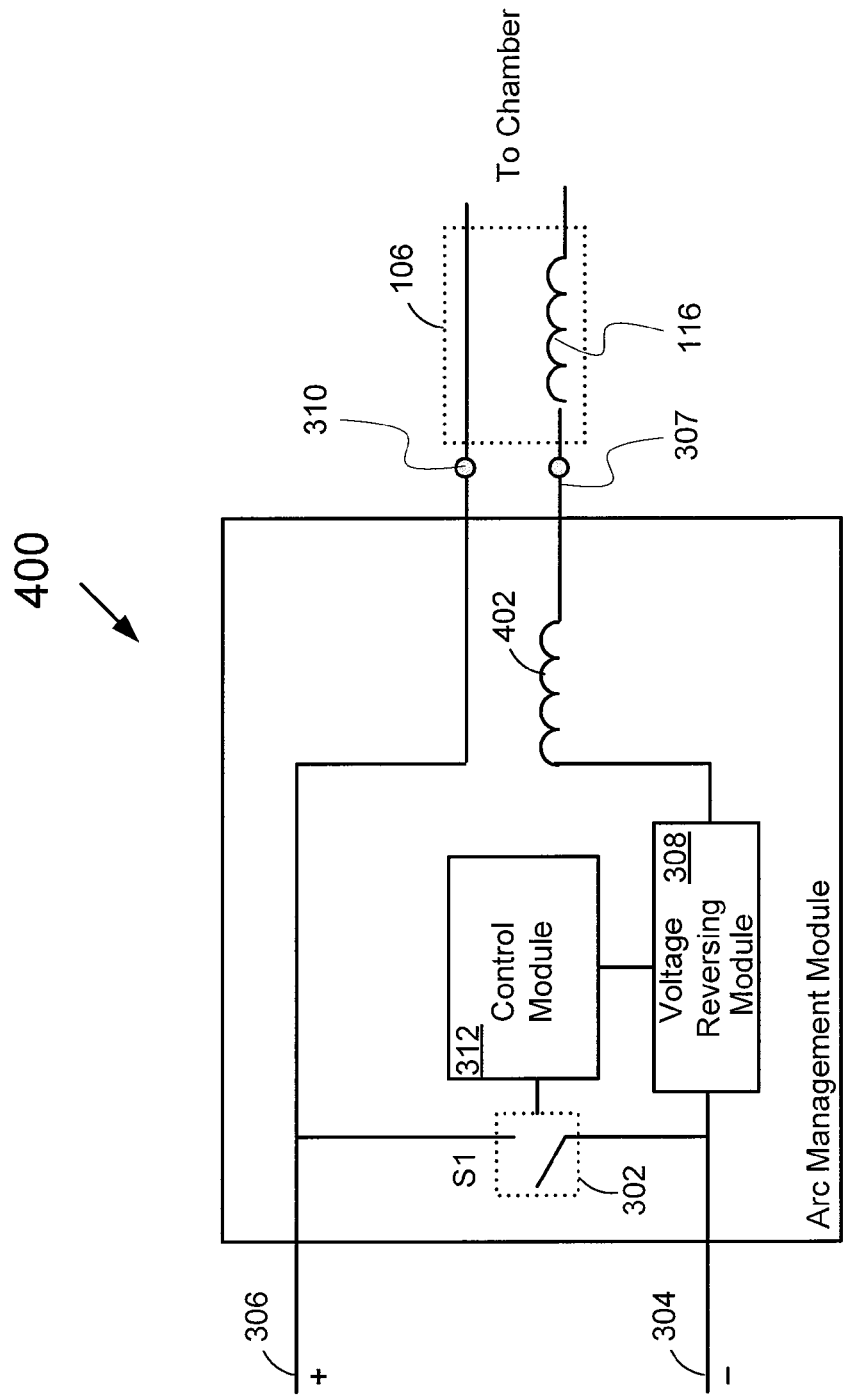
FIG. 4 is a block diagram depicting another embodiment of the arc-management modules of FIGS. 1 and 2.

Referring next to FIG. 4 for example, shown is a block diagram 300 of another embodiment of the arc-management modules 110, 210 depicted in FIGS. 1 and 2. As shown, the arc management module 400 in this embodiment is configured in much the same way as the arc-management module described with reference to FIG. 3 except that an inductor 402 is disposed between the voltage reversing module 308 and the first output terminal 307.

In operation, the inductor 402 stores energy during the first mode of operation when current is flowing from the chamber 104 back to the first input 304 through the voltage-reversing module 308. And during a second mode of operation, the voltage-reversing module 308 utilizes the stored energy from the inductor 402 and 116 to generate a reverse voltage, which is applied across the output terminals 307, 310 to help prevent and/or help extinguish arcs within the chamber 104.

In one variation of this embodiment, the inductor 402 is sized so that the energy stored in the inductor 402 is substantially greater than the energy stored in the cable 106, and as a consequence, a relatively small portion of the energy used to generate the reverse voltage is from the supply cable 106.

Referring next to FIGS. 5A-5H, shown are schematic diagrams depicting exemplary embodiments of the voltage reversing module of FIGS. 3 and 4. In the embodiment depicted in FIG. 5A, a series switch S2 is shown in parallel with a series combination of a capacitor C1 and a diode D1. In addition, the series switch S2 is also arranged in parallel with a series combination of a first resistor R1, a second resistor R2 and a second diode D2. As shown, the first resistor R1 is arranged across terminals of the capacitor C1 and the series combination of the second resistor R2 and the second diode D2 is arranged across terminals of the first diode.

The series switch S2 in some embodiments is realized by an insulated gate bipolar transistor (IGBT), and in other embodiments is a field effect transistor (FET). In yet other embodiments the series switch S2 may be implemented by an Integrated Gate Commutated Thyristor (IGCT), a metal-oxide semiconductor-controlled thyristor (MCT), a bipolar switch, or silicon-controlled rectifier. The diodes D1, D2 in the exemplary embodiment are fast recovery diodes.

The capacitor C1 in this embodiment is sized to be sufficiently large to store the energy from the supply cable 106 and create a voltage reversal across the output terminals 307, 310 without causing a dangerous voltage across the series switch S2. In addition, the capacitor C1 is also sized so that a resonant frequency between the capacitor C1 and the inductance 116 of the supply cable 106 helps to ring the cable current to zero. In general, the higher the voltage is permitted to climb across the capacitor C1, the sooner an arc is extinguished and the lower the arc energy.

With respect to the value of the capacitor C1, a minimum value may be calculated by $$C1_{min} = \frac{I_{max}^2 * L\_Cable}{V_{C1max}^2}$$

Where $V_{C1max}$ is the maximum desired reverse voltage and $I_{max}$ is the maximum output current through the output cable 106. The time it takes to the cable current to reach zero amps, assuming the inductance 116 of the cable dominates the inductance of the loop, is roughly $$Tring = (\pi/2) * \sqrt{(C_1 * L\_Cable)}$$

Where Tring is the ring out time and L_cable is the inductance 116 of the supply cable 106. As a consequence, C1 may be sized based upon several factors including $V_{C1max}$, which may be established to apply an effective reverse voltage at the chamber to prevent reverse sputtering. In some embodiments for example, $V_{C1max}$ is limited to voltages to less than about 150 Volts. Although the particular values for C1, $I_{max}$ and $V_{C1max}$ may vary depending upon several factors including, but certainly not limited to, the particular application, the type of cable and the type of chamber used, in one embodiment, C1 was realized by a 13 micro Farad capacitor while $I_{max}$ was 1000 Amps and $V_{C1max}$ was less than 150 Volts.

In operation, when the shunt switch 302 (shown in FIGS. 3 and 4) is closed, the capacitor C1 is placed across the output terminals 307, 310 so that when the series switch S2 is opened, energy from the supply cable 106 begins to charge the capacitor C1 through D1. In some embodiments the series switch S2 is opened just after the shunt switch 302 is closed, and in other embodiments the series switch S2 is opened simultaneously with the shunt switch 302 closing. In yet other embodiments, the series switch S2 is opened just before the shunt switch 302 is closed.

As the capacitor C1 charges, it places a reverse voltage across the output terminals 307, 310 (e.g., a positive voltage at the first output terminal 307 relative to the second output terminal 310), and the reverse voltage is applied to the chamber 104 with the supply cable 106; thus reducing the chamber current at a faster rate relative to systems that merely restrict current supplied to a chamber. The first resistor R1 in this embodiment begins to dissipate energy stored in the supply cable 106 while the series switch S2 is still open, and once the series switch S2 closes, the second resistor discharges the capacitor C1.

Figure 5A:
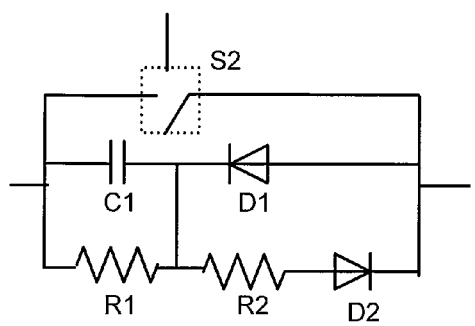
Figure 5B:
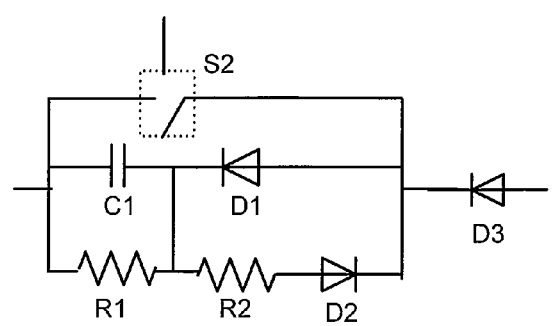

Referring next to FIG. 5B, shown is another embodiment of a voltage reversing module, which includes a blocking diode D3 configured to limit the voltage reversal seen at the output terminals 307, 308 without substantially affecting the arc energy. Although certainly not required, in alternative embodiments the blocking diode D3 is also added to the voltage reversing modules depicted in FIGS. 5C-5H. Adding a blocking diode enables a higher $V_{C1max}$ to be applied to the chamber, which lowers arc energy and reduces Tring; thus helping to prevent reverse sputtering on the anode of the chamber.

Figure 5C:
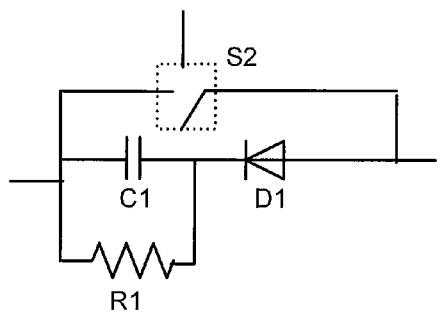

As shown in FIG. 5C, in one embodiment a voltage reversing module is realized without the second resistor R2 and the second diode D2 described with reference to FIG. 5A. As a consequence, in this embodiment, the capacitor C1 discharges through R1.

Figure 5D:
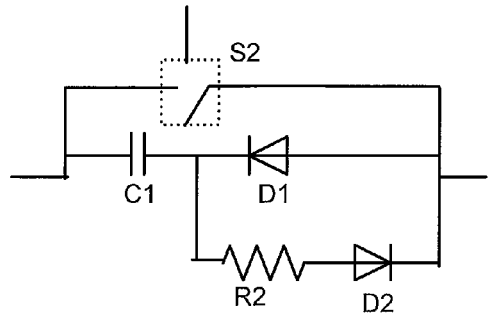

With respect to FIG. 5D, it shows a voltage reversing module in which the first resistor R1 that is described with reference to FIG. 5A is removed, so that the capacitor C1 discharges through the second resistor R2 and the second diode D2.

Turning to FIG. 5E, shown is a voltage reversing module that includes a zener diode D4 in series with resistor R1 that is configured to keep the voltage across the capacitor C1 at a substantially constant voltage, and in some embodiments, at a peak voltage.

Referring to FIG. 5F, a voltage reversing module is depicted that includes only a series combination of a capacitor C1 and diode D1 arranged in parallel with the series switch S2.

As shown in FIG. 5G, in one embodiment a discharge module is connected across the capacitor C1 to discharge the energy stored on C1 back to an output of a power supply (e.g., power supply 202).

Referring next to FIG. 5H shown is an embodiment of a voltage reversing module that is similar to the voltage reversing module described with reference to FIG. 5A, except a zenor diode is places in parallel with C1 and R1 to limit the voltage across C1. In one variation, for example, the voltage across C1 is limited to a voltage less than 150 Volts.

Figure 6:
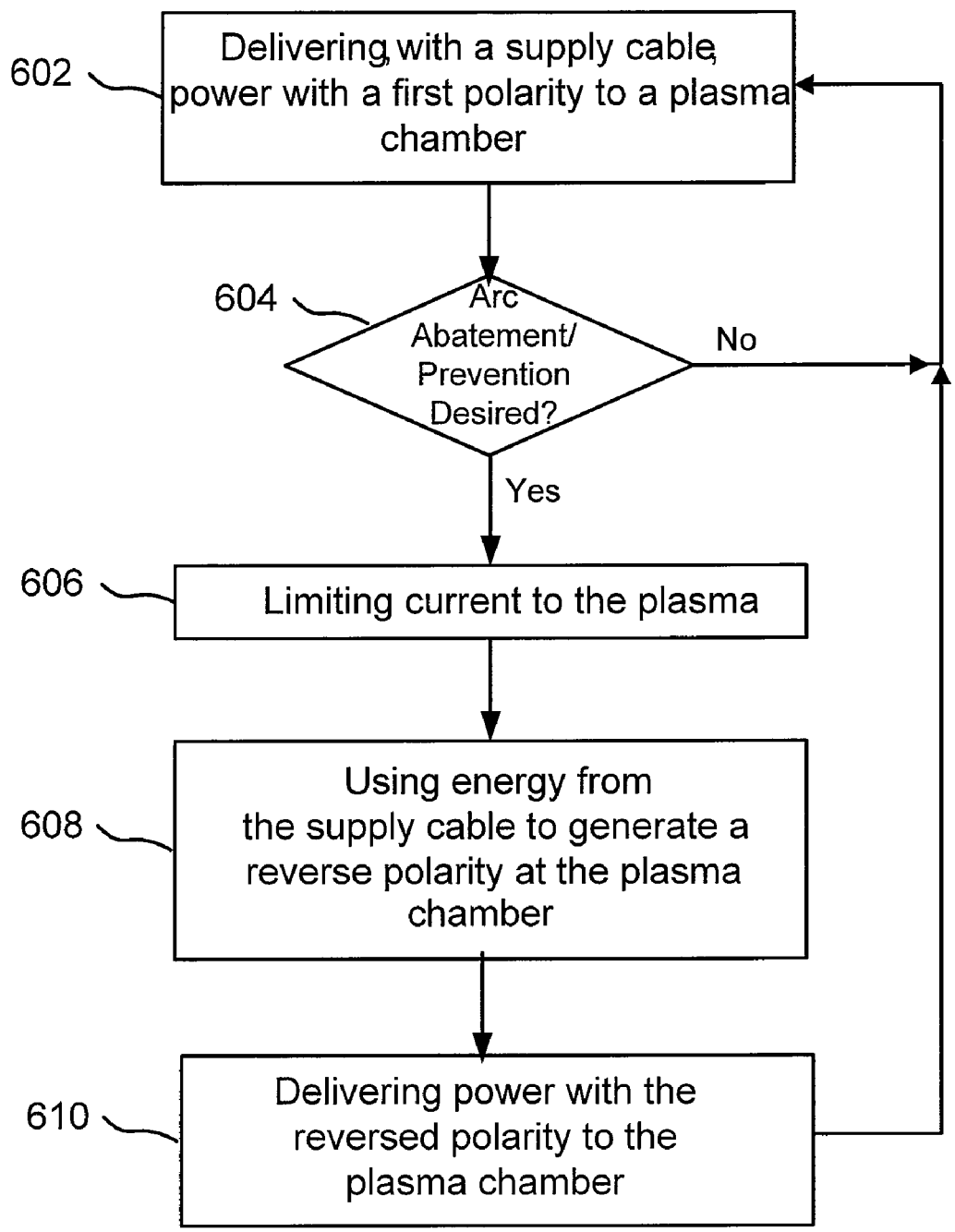
FIG. 6 is a flowchart depicting a method in accordance with many embodiments.

Referring next to FIG. 6, shown is a flowchart depicting steps traversed in accordance with a method for delivering power to a plasma chamber. While referring to FIG. 6, simultaneous reference will be made to embodiments described with reference to FIGS. 1-5 for exemplary purposes, but the method depicted in FIG. 6 is certainly not limited to the specific embodiments previously described. As shown in FIG. 6, power is delivered with a supply cable (e.g., the supply cable 106) with a first polarity to a plasma chamber (e.g., the plasma chamber 104)(Block 602), and if arc abatement or arc prevention is desired (Block 604), then the current delivered to the chamber with the first polarity is limited (Block 606).

In some embodiments, detection of an arc renders arc abatement desirable, and as a consequence, when an arc is detected in these embodiments, the current delivered to the chamber with the first polarity is limited. In alternative embodiments, in order to prevent arcs from forming, it is desirable to periodically limit the current that is delivered to the chamber with the first polarity. In these alternative embodiments Blocks 606-610 may be carried out several times a second (e.g., between 500 Hz and 500 kHz).

In addition to limiting current to the plasma chamber, energy from the supply cable is used to generate, at least temporarily, a reverse polarity voltage at the plasma chamber (Block 608), and voltage is applied to the plasma chamber with a reverse polarity (Block 610). As depicted, after current is delivered to the chamber with a reverse polarity (Block 610), power is again delivered to the chamber with a first polarity (Block 602).

In conclusion, the present invention provides, among other things, a system and method for managing the power provided to a plasma-processing chamber. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. An apparatus comprising:
a first and second output terminals;
a power module configured to provide a voltage with a first polarity to the first and second output terminals, each of the first and second output terminals adapted to couple with a corresponding one of two conductors of a plasma-chamber-supply cable; and
an arc-management module connected to the first and second output terminals, the arc-management module configured to provide, using energy stored in the plasma-chamber-supply cable, a reverse voltage across the first and second output terminals, the reverse voltage having a polarity that is opposite of the first polarity;
a shunt switch connected between the first and second output terminals and arranged in parallel with the power module so as to be capable of shunting current from the power module when closed;
a voltage-reversing module arranged in series with the first conductor, the voltage-reversing module configured to carry current with a series switch from the power module to the first conductor while the first and second output terminals have the first polarity and receive energy stored in the plasma-chamber-supply cable while the series switch is open so as to be capable of generating the reverse voltage; and
a control module configured to close the shunt switch and open the series switch so as to enable the voltage-reversing module to generate the reverse voltage.

2. The apparatus of claim 1 wherein the arc-management module is configured to shunt current from the power module while providing the reverse voltage to the first and second output terminals.

3. The apparatus of claim 1, wherein the arc-management module is configured to provide the reverse voltage to the first and second output terminals in response to receiving an arc-indication signal.

4. The apparatus of claim 1, wherein the arc-management module is configured to periodically provide the reverse voltage to the first and second output terminals.

5. The apparatus of claim 1, wherein the voltage-reversing module includes a capacitor arranged in parallel with the series switch and configured to build a charge in response to receiving the energy stored in the plasma-chamber-supply cable, the charge placing the reverse voltage across the first and second output terminals.

6. The apparatus of claim 5, including a diode in series with the capacitor, the diode configured to enable the capacitor to peak charge when the series switch is opened.

7. An apparatus comprising:
a first and second input terminals adapted to receive a voltage, the received voltage characterized by a first polarity across the first and second input terminals;
a first and second output terminals, the second output terminal connected to the second input terminal, the first output terminal adapted to couple with a first conductor of a plasma-chamber-supply cable and the second output terminal adapted to couple with a second conductor of the plasma-chamber-supply cable;
a shunt switch disposed so as to be capable of shunting current away from the at least two output terminals when closed;
a voltage-reversing module connected between the first input terminal and the first output terminal, the voltage-reversing module configured to carry current from the first input terminal to the first output terminal while operating in a first operating mode so as to provide the voltage with the first polarity across the first and second output terminals, and wherein the voltage-reversing module is configured, in a second operating mode, to generate, using energy from the plasma-chamber-supply cable, a reverse voltage across the first and second output terminals while the shunt switch is closed, the reverse voltage having a polarity that is opposite of the first polarity; and
a control portion configured to close the shunt switch and prompt the voltage-reversing module to operate in the second operating mode so as to enable the voltage-reversing module to generate the reverse voltage across the first and second output terminals
a series switch arranged in series between the first input terminal and the first output terminal and configured, during the first operating mode, to be closed so as to carry the current from the first input terminal to the first output terminal; and
a capacitor configured to receive, while the series switch is opened in the second operating mode, energy from the first plasma-chamber-supply cable so as to build a charge, the charge placing the reverse voltage across the first and second output terminals.

8. The apparatus of claim 7, wherein the control portion is configured to close the shunt switch and prompt the voltage-reversing module to operate in the second operating mode in response to an arc being detected across the first and second conductors of the plasma-chamber-supply cable.

9. The apparatus of claim 7, wherein the control portion is configured to periodically close the shunt switch and prompt the voltage-reversing module to operate in the second operating mode.

10. The apparatus of claim 7, including an inductor connected between the shunt switch and the first input terminal, the inductance of the inductor enabling the shunt switch to close without short-circuiting a power supply that provides the voltage to the first and second input terminals.

* * * * *